United States Patent
Zhang

(10) Patent No.: US 11,171,203 B2
(45) Date of Patent: Nov. 9, 2021

(54) HIGH ELECTRON MOBILITY TRANSISTORS WITH CHARGE COMPENSATION

(71) Applicant: Virginia Tech Intellectual Properties, Inc., Blacksburg, VA (US)

(72) Inventor: Yuhao Zhang, Blacksburg, VA (US)

(73) Assignee: VIRGINIA TECH INTELLECTUAL PROPERTIES, INC., Blacksburg, VA (US)

(*) Notice: Subject to any disclaimer, the term of this patent is extended or adjusted under 35 U.S.C. 154(b) by 47 days.

(21) Appl. No.: 16/881,846

(22) Filed: May 22, 2020

(65) Prior Publication Data

US 2020/0373383 A1    Nov. 26, 2020

Related U.S. Application Data

(60) Provisional application No. 62/851,367, filed on May 22, 2019.

(51) Int. Cl.

| | | |
|---|---|---|
| *H01L 29/778* | (2006.01) | |
| *H01L 29/06* | (2006.01) | |
| *H01L 29/20* | (2006.01) | |
| *H01L 29/40* | (2006.01) | |
| *H01L 29/205* | (2006.01) | |

(52) U.S. Cl.
CPC ...... *H01L 29/0634* (2013.01); *H01L 29/2003* (2013.01); *H01L 29/205* (2013.01); *H01L 29/402* (2013.01); *H01L 29/7786* (2013.01); *H01L 29/7787* (2013.01)

(58) Field of Classification Search
None
See application file for complete search history.

(56) References Cited

U.S. PATENT DOCUMENTS

2021/0202728 A1* 7/2021 Nongaillard ........ H01L 29/0623

* cited by examiner

*Primary Examiner* — Grant S Withers
(74) *Attorney, Agent, or Firm* — Innovators Legal

(57) ABSTRACT

A variety of high electron mobility transistor structures are provided having charge compensation regions that can extend below the gate electrode through the barrier layer and at least partially through the III-V semiconductor layer. The charge compensation regions include a p-type semiconductor or oxide. In some aspects, the charge compensation regions extend vertically through said barrier layer into said channel layer, wherein said charge-compensation regions are doped with p-type dopants and are placed aside the 2DEG channel and do not overlap vertically with the 2DEG channel. In some aspects, at least a portion of the charge compensation regions extend from below the gate electrode to make Ohmic contact with the source electrode. In some aspects, by extending the charge compensation regions from below the gate electrode and closer to the source and drain electrodes, the HEFTs can demonstrate avalanche characteristics. The HEMTs can include any suitable III-V semiconductor, and in particular can include a GaN semiconductor.

20 Claims, 10 Drawing Sheets

HIGH ELECTRON MOBILITY TRANSISTORS WITH CHARGE COMPENSATION

CROSS-REFERENCE TO RELATED APPLICATIONS

This application claims priority to, and the benefit of, U.S. provisional application entitled "HIGH ELECTRON MOBILITY TRANSISTORS WITH CHARGE COMPENSATION" having Ser. No. 62/851,367, filed May 22, 2019, the contents of which are incorporated by reference in their entirety.

TECHNICAL FIELD

The present disclosure generally relates to high electron-mobility transistors.

BACKGROUND

Improved power devices are highly desired for high-efficiency electricity generation and conversion. Applications of power devices include power supplies, automotive electronics, motor controls and drives, data centers, telecommunication circuits, display drives and mobile power management, for example. Such systems rely on efficient converters to step-up or step-down electric voltages and convert between AC and DC signals. Power transistors capable of blocking a certain voltage and carrying a certain current are key building blocks for such converters.

Conventional power devices (e.g. transistors or diodes) used in such applications are mainly made of silicon. However, the limited breakdown voltage of silicon and its higher resistance make the commercial devices and circuits currently available very bulky, heavy and operate at low frequencies. Thanks to the superior physical properties of gallium nitride (GaN), e.g. high critical electric field, excellent transport properties, and high-temperature capability, compared to silicon, nitride power devices are widely perceived as excellent candidates for the next-generation of high-frequency and high-efficient power applications. Nitride power devices have potentials to realize over 100-fold lower on-resistance compared to silicon power devices with a similar voltage class. This could greatly reduce the device power loss in power switching applications.

Currently, nitride-based high electron mobility transistors (HEMTs) which utilize a two-dimensional-gas (2DEG) channel, have been regarded as one of the most promising candidates for high-efficiency and high-frequency applications. The electron mobility of the 2DEG channel is at least ten-fold higher than that in conventional metal-oxide-semiconductor (MOS) channel. This enables lower device resistance and power loss.

Despite the tremendous potential of HEMTs, there are several technical problems that remain to be resolved. For example, reliable formation of normally-off transistors without increasing the device on-resistance remains a challenge with nitride-based high electron mobility transistors. Nitride transistors which do not allow current to flow in the absence of an applied gate voltage are desirable to simplify circuit design and to enable fail-safe operation in power electronics. However, existing attempts to solve this problem have resulted in sacrificing an increased device resistance to achieve the desired device normally-off operation. A second problem with existing nitride-based high electron mobility transistors is the realization of rugged breakdown voltage with avalanche capability. Avalanche is an impact ionization phenomenon that allows a device to dissipate surge energy in abnormal circuit events. The lack of avalanche capability in nitride transistors significantly undermines the device ruggedness. Novel device designs that enable the avalanche breakdown in nitride HEMTs are therefore highly desired.

There remains a need for improved high electron mobility transistors that overcome the aforementioned deficiencies such as forming normally-off transistors without sacrificing the device resistance and transistors which demonstrate avalanche breakdown.

SUMMARY

Described herein are a variety of HEMT structures that overcome one or more of the aforementioned problems. In particular aspects, HEMT devices are provided where the 2DEG channel is preserved in the gate region with high electron concentrations at low gate bias. This is advantageous for nitride HEMTs, especially for low-voltage (e.g. below 100 V) devices where the resistance in the gate region becomes a main contributor to the total device resistance. In addition, in some aspects, HEMT devices are provided that enable the avalanche breakdown.

In some aspects, a high electron mobility transistor (HEMT) device is provided having a plurality of active semiconductor layers formed on a substrate, the plurality of active semiconductor layers comprising at least a III-V semiconductor layer and a barrier layer, wherein a two dimensional electron gas (2DEG) is formed at a heterointerface between the III-V semiconductor layer and the barrier layer; source and drain electrodes each formed in Ohmic contact with the 2DEG; a gate electrode positioned above the barrier layer between the source electrode and the gate electrode; and a plurality of charge-compensation regions below the gate electrode, wherein the charge-compensation regions comprise a p-type material and extend through the barrier layer and at least partially through the III-V semiconductor layer.

Other systems, methods, features, and advantages of HMETs will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Further aspects of the present disclosure will be readily appreciated upon review of the detailed description of its various embodiments, described below, when taken in conjunction with the accompanying drawings.

FIG. 1A depicts a p-(Al)GaN gate. FIG. 1B depicts a gate recess. FIG. 1C depicts a charge engineering HEMT. FIG. 1D depicts a cascode HEMT configuration.

FIG. 2A is a 3-D diagram of a first exemplary GaN-based HEMT according to various aspects. FIG. 2B is a perspective diagram of semiconductor regions of the first exemplary GaN-based HEMT. FIG. 2C is a cross-sectional diagram of the first exemplary GaN-based HEMT along the cutline A-A' in FIG. 2A. FIG. 2D is a simplified cross-sectional diagram illustrating a second exemplary GaN-based HEMT. FIG. 2E is a simplified cross-sectional diagram illustrating a third exemplary GaN-based HEMT.

FIG. 3A is a 3-D diagram of a fourth exemplary GaN-based HEMT. FIG. 3B is a perspective diagram of semiconductor regions of the fourth exemplary GaN-based HEMT. FIG. 3C is a top view of semiconductor regions of the fourth exemplary GaN-based HEMT. FIG. 3D is a schematic illustration of electric field distribution in the fourth exemplary GaN-based HEMT along the cutline B-B' in FIG. 3C, comparing the electric field distribution with (solid line) and without (dashed line) the charge-compensation regions 25.

FIG. 4A is a top-view diagram of a fifth exemplary GaN-based HEMT. FIG. 4B is a top-view diagram of a sixth exemplary GaN-based HEMT. FIG. 4C is a top-view diagram of a seventh exemplary GaN-based HEMT.

FIG. 5A is a top-view diagram of an eighth exemplary GaN-based HEMT. FIG. 5B is a top-view diagram of a ninth exemplary GaN-based HEMT. FIG. 5C is a top-view diagram of a tenth exemplary GaN-based HEMT.

DETAILED DESCRIPTION

Figure 1A:
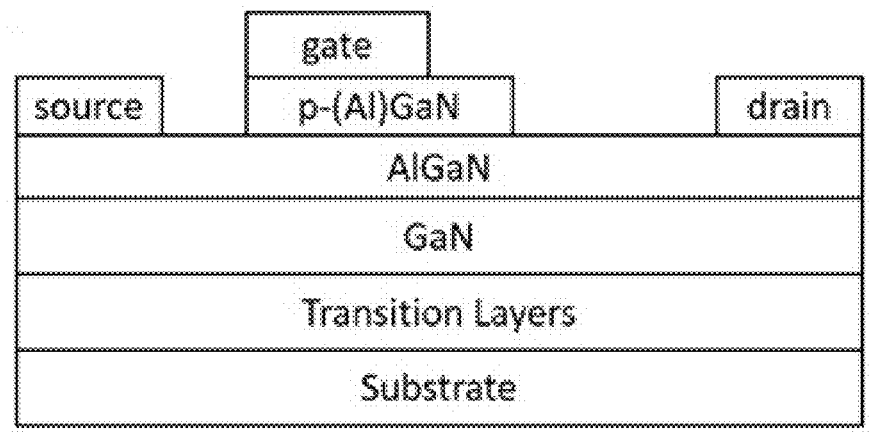
FIGS. 1A-1D depict schematics of four main E-mode technologies developed for nitride HEMTs.
Figure 1B:
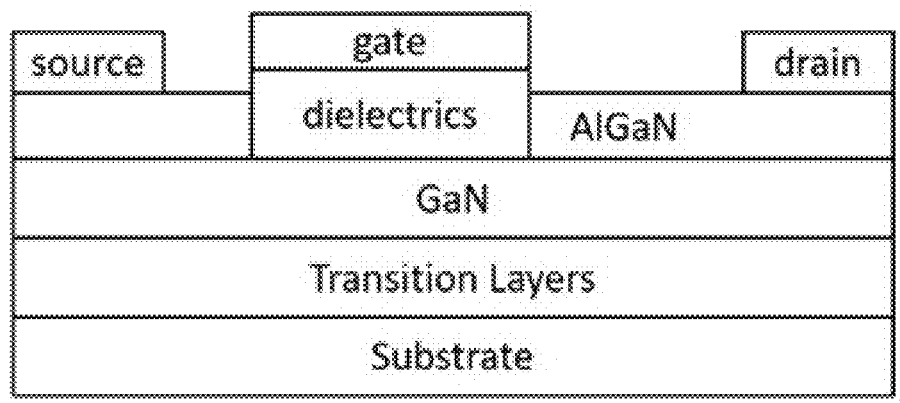
Figure 1C:
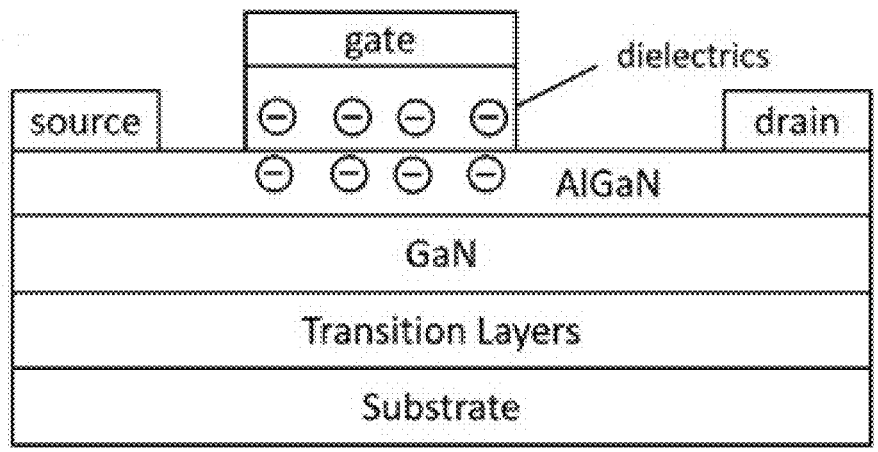
Figure 1D:
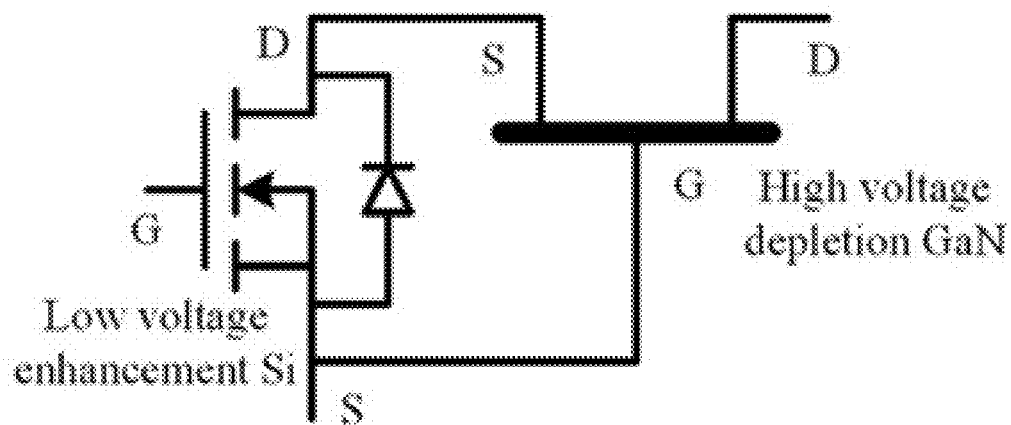

The development of improved nitride transistors has faced a variety of challenges. The first challenging problem is the reliable formation of normally-off transistors without increasing the device on-resistance. The normally-off is referred to herein as enhancement mode or E-mode, and the normally-on as depletion mode or D-mode. E-mode nitride transistors, which do not allow current to flow in the absence of an applied gate voltage, are desirable to simplify circuit design and to enable fail-safe operation in power electronics. Currently, four main technologies have been developed to make E-mode nitride HEMTs, i.e. p-(Al)GaN gate [1]-[6] (FIG. 1A), gate recess [7][8] (FIG. 1B), charge engineering [9]-[12] (FIG. 1C) and Cascode configuration [13]-[15] (FIG. 1D). All of these technologies realize the device normally-off operation at the price of an increased device resistance. The first three technologies significantly increase the channel resistance in the gate region. In the first approach, the insertion of thick p-(Al)GaN layer reduces the gate capacitance, leading to smaller electron densities under the gate. In the second approach, the 2DEG channel is replaced with a MOS channel under gate, leading to a much lower electron mobility under gate. In the third approach, the introduced negative charges reduce the electron densities under gate. In the fourth approach, the silicon MOSFET introduces additional resistance to the cascoded D-mode HEMT. The technologies have not been able to demonstrate an E-mode transistor where the 2DEG channel is preserved in the gate region with a relatively large gate capacitance. The relatively large gate capacitance is desired for nitride HEMTs, especially for low-voltage (e.g. below 100 V) devices where the resistance in the gate region becomes a main contributor to the total device resistance.

A second challenge faced by existing nitride HEMTs is the realization of rugged breakdown voltage with avalanche capability. When the nitride HEMT is biased close to its breakdown voltage, the electric field distribution is highly non-uniform with a peak value in semiconductors near the drain-side edge of the gate. As the HEMT channel is n-type and there is no p-type region close to the peak electric field locations, the excess holes generated in the impact ionization cannot be effectively removed. As a result, existing nitride HEMTs do not have avalanche capability and typically show a destructive breakdown. In contrast, most of silicon and silicon carbide power MOSFETs have avalanche breakdown. The avalanche capability allows power devices to dissipate the excess energy in inductive loads without catastrophic device failure during some overload power switching transients, and therefore provides the device ruggedness for many power electronics applications, such as motor drive applications. The lack of avalanche capability in nitride transistors significantly undermines the device ruggedness.

Described herein are a variety of HEMT structures that overcome one or more of the aforementioned problems. In particular aspects, HEMT devices are provided where the 2DEG channel is preserved in the gate region with a high electron concentrations at low gate bias. This is advantageous for nitride HEMTs, especially for low-voltage (e.g. below 100 V) devices where the resistance in the gate region becomes a main contributor to the total device resistance. In addition, in some aspects, HEMT devices are provided that enable the avalanche breakdown.

In some aspects, HEMT devices are provided having p-type charge-compensation structures in the close vicinity of the 2DEG channels in nitride HEMTs. In some aspects, alternating p-type charge-compensation structures and 2DEG channels are implemented in the gate region. In some aspects, a nitride HEMT is provided with uniform electric field distribution at off-state biases. In certain aspects, p-type charge-compensation structures are implemented in the semiconductor channel regions between gate and drain. A nitride HEMT can also be provided in some aspects with avalanche breakdown and improved ruggedness. In these aspects, p-type charge-compensation structures are implemented between source and drain and form electronic contact with the source electrode. These various aspects solve some most challenging problems of nitride HEMTs.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting. The skilled artisan will recognize many variants and adaptations of the embodiments described herein. These variants and adaptations are intended to be included in the teachings of this disclosure.

All publications and patents cited in this specification are cited to disclose and describe the methods and/or materials in connection with which the publications are cited. All such publications and patents are herein incorporated by references as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant specification should not be treated as such and should not be read as defining any terms appearing in the accompanying claims. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

Although any methods and materials similar or equivalent to those described herein can also be used in the practice or testing of the present disclosure, the preferred methods and materials are now described. Functions or constructions well-known in the art may not be described in detail for brevity and/or clarity. Embodiments of the present disclosure will employ, unless otherwise indicated, techniques of nanotechnology, organic chemistry, material science and engineering and the like, which are within the skill of the art. Such techniques are explained fully in the literature.

It should be noted that ratios, concentrations, amounts, and other numerical data can be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to about 5%" should be interpreted to include not only the explicitly recited values of about 0.1% to about 5%, but also include individual values (e.g., 1%, 2%, 3%, and 4%) and the sub-ranges (e.g., 0.5%, 1.1%, 2.2%, 3.3%, and 4.4%) within the indicated range. Where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In some embodiments, the term "about" can include traditional rounding according to significant figures of the numerical value. In addition, the phrase "about 'x' to 'y'", where 'x' and 'y' are numerical values, includes "about 'x' to about 'y'".

In some instances, units may be used herein that are non-metric or non-SI units. Such units may be, for instance, in U.S. Customary Measures, e.g., as set forth by the National Institute of Standards and Technology, Department of Commerce, United States of America in publications such as NIST HB 44, NIST HB 133, NIST SP 811, NIST SP 1038, NBS Miscellaneous Publication 214, and the like. The units in U.S. Customary Measures are understood to include equivalent dimensions in metric and other units (e.g., a dimension disclosed as "1 inch" is intended to mean an equivalent dimension of "2.5 cm"; a unit disclosed as "1 pcf" is intended to mean an equivalent dimension of 0.157 kN/m$^3$; or a unit disclosed 100° F. is intended to mean an equivalent dimension of 37.8° C.; and the like) as understood by a person of ordinary skill in the art.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Definitions

Unless defined otherwise, all technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

The articles "a" and "an," as used herein, mean one or more when applied to any feature in embodiments of the present invention described in the specification and claims. The use of "a" and "an" does not limit the meaning to a single feature unless such a limit is specifically stated. The article "the" preceding singular or plural nouns or noun phrases denotes a particular specified feature or particular specified features and may have a singular or plural connotation depending upon the context in which it is used.

High Electron Mobility Transistors

The majority of existing E-mode technologies involve the reduction of 2DEG density or mobility in the whole area below the gate electrode. For example, p-(Al)GaN gate technologies [1]-[4][6][10][11] lay p-type layers and other charge-compensation structures on top of or within the entire heterostructures in the gate region. This can be contrasted to various aspects of the current disclosure which introduce charge compensation structures selectively in the gate region and the charge-compensation regions are located aside the 2DEG channel rather than on top of the 2DEG channel. Gate recess technologies [7] thin down or completely remove the barrier layer in the whole gate region. In comparison, the various aspects described herein can preserve the complete barrier layer in the partial gate region. Reference [16] selectively removes the heterostructure in the gate region. In comparison, aspects described herein do not involve these charge-compensation structures.

References [17]-[19] describes III-nitride FETs with a p-type back-barrier layer below the n-type channel. Reference. [17] describes III-nitride HEMTs with a p-type back-barrier below the 2DEG channel extending laterally from the source to the gate. Reference [18] describes III-nitride HEMTs with a p-type back-barrier below the 2DEG channel extending laterally from the source to the drain. Reference [19] describes III-nitride HEMTs with a p-type diamond back-barrier. In the aspects described in the current disclosure, the charge-compensation regions are located aside the 2DEG channel rather than below the 2DEG channel.

Figure 6:
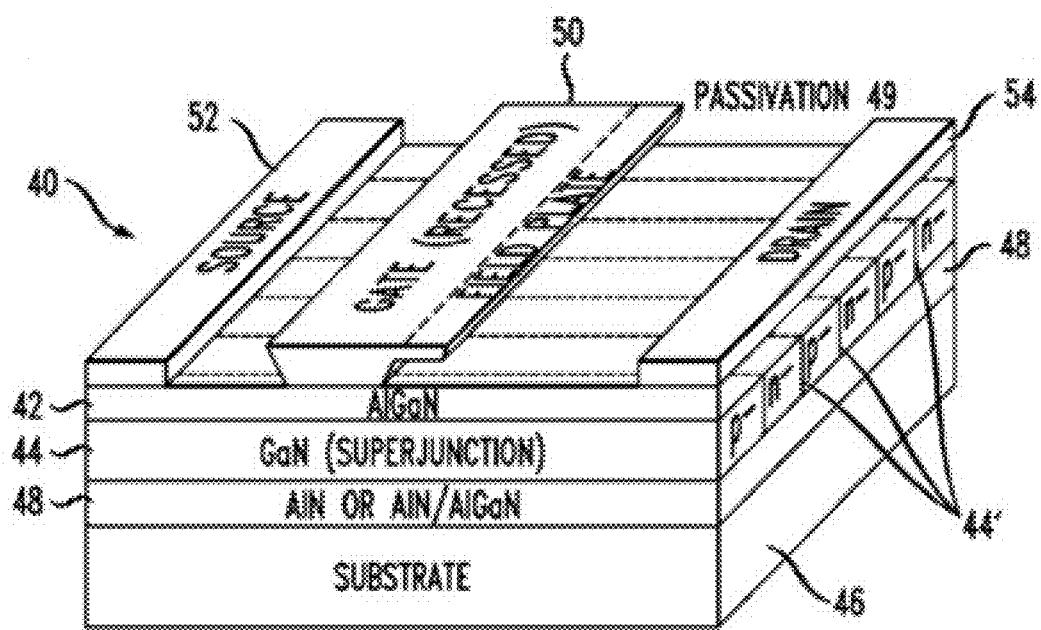
FIG. 6 depicts a diagram of a GaN-based transistor structures from Ref. [20].

Reference [20] describes III-nitride HEMTs with a plurality of alternating p-GaN and n-GaN channels, as shown in the FIG. 6 whereas in the aspects described in the instant disclosure the barrier layer (AlGaN) on top of p-GaN is not removed, which cannot completely remove the 2DEG channel in the charge-compensation regions and undermine the charge compensation effects. In Reference [20], the charge compensation is established between the p-GaN bands and n-GaN bands while the charge compensation is established between the p-type regions and the 2DEG channel in the aspects described herein. In addition, the p-type regions in Reference [20] do not form contact to any electrodes (source, gate and drain) and therefore cannot enable the hole removal and device avalanche capability.

Reference [21] describes III-nitride HEMTs with a plurality of alternating p-AlGaN and n-AlGaN bands on top of the AlGaN barrier layer whereas the p-type regions described in the instant disclosure do not extend downwards into the GaN channel region in [21]. As a result, 2DEG are present under the p-type regions in [21], while the 2DEG is completely removed in the p-type regions in various aspects of the devices described herein.

As described in more detail herein, HEMTs are providing operating in E-mode. HEMTs are also provided having improved electric field management. HEMTs are also provided having avalanche capability. In some aspects, the HEMTs are group III-V semiconductor HEMTs. In some aspects, the HEMTs described herein are GaN HEMTs.

E-Mode HEMTs

Figure 2A:
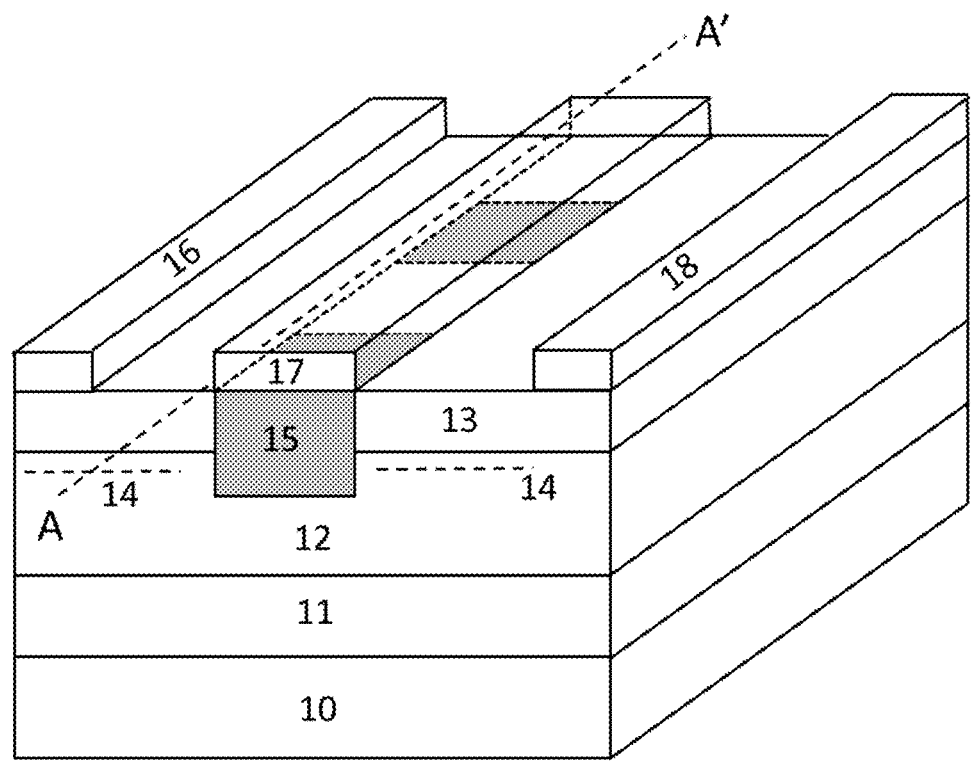
FIGS. 2A-2E are simplified diagrams illustrating various exemplary GaN-based HEMTs with charge compensation structures.
Figure 2B:
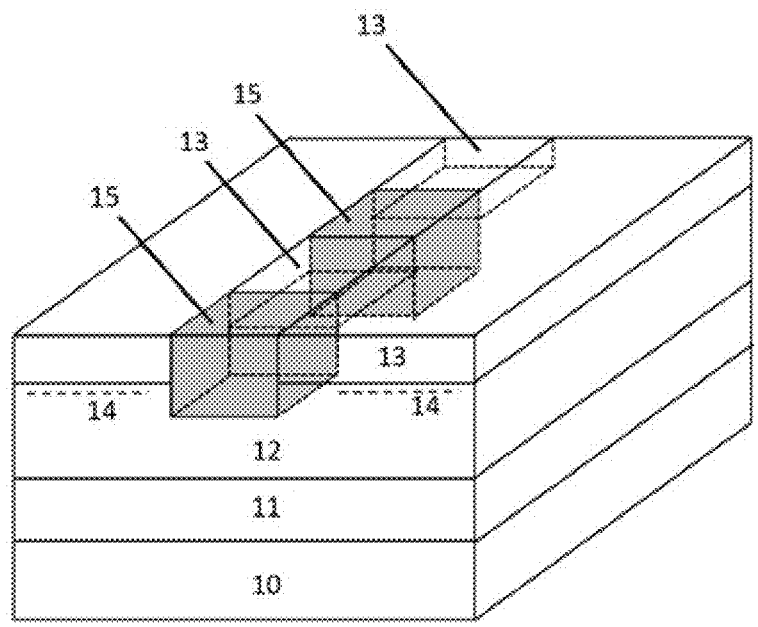
Figure 2C:
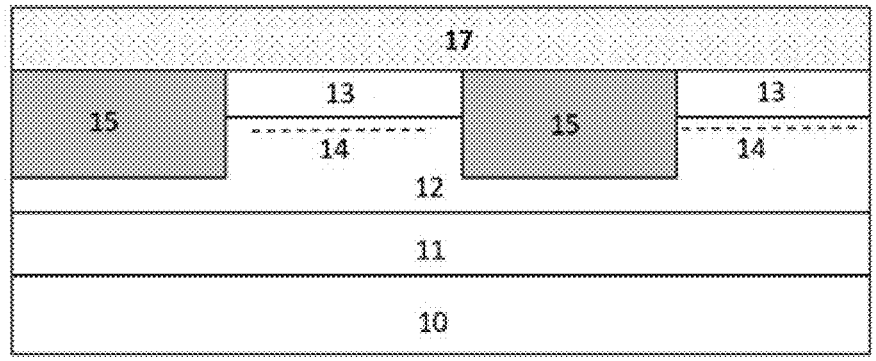

FIGS. 2A-2C show simplified diagrams illustrating one embodiment of the nitride HEMTs with charge compensation structures. The region 10 is a substrate layer, such as GaN, silicon carbide, silicon, sapphire, diamond and AlN. Region 11 may be composed of a single layer or multiple buffer layers, including adhesion, nucleation, transition and other layers for promoting the growth of the compound semiconductor epitaxial layers on lattice-mismatched substrates. The materials of region 11 can be binary III-V materials such as AlN and GaN, ternary III-V materials such as InGaN and AlGaN, and quaternary III-V materials such as AlInGaN. In some embodiments, the transition layers in region 11 can be superlattice structure and compositionally-graded layers.

A III-V semiconductor layer 12 is disposed on the said region 11, with an exemplary thickness of 100 nm to 10 μm. In some embodiments, the materials of layer 12 can be III-nitride or III-arsenide materials. The said layer 12 may be low-level n-type doped, un-intentionally doped, or p-type doped, but preferably as un-intentionally doped or low-level n-type doped. A III-V barrier layer 13 is disposed on the said III-V semiconductor layer 12, with an exemplary thickness of 5 nm to 100 nm. The material of layer 13 has a different lattice constant and bandgap energy compared to material of layer 12. In some embodiments, the material of layer 13 has larger bandgap energy than the material of layer 12, and a 2DEG channel 14 is formed at the heterostructure of layer 13 and layer 12. In a specific embodiment, materials of layer 13 and layer 12 can be InAlGaN and GaN, AlGaN and GaN, AlN and GaN, or InGaN and GaN.

A plurality of semiconductor regions 15 are formed extending downward through the layer 13 into the layer 12. Region 15 has a conductivity type opposite to the region 12 and the 2DEG channel 14, preferably as p-type doped. Region 15 can be doped with p-type dopants such as Magnesium (Mg) with an exemplary doping density of $1\times10^{16}$ cm$^{-3}$ to $1\times10^{21}$ cm$^{-3}$. The material of region 15 can be identical to the material of the layer 12 or the material of the layer 13, such as GaN, AlGaN, InGaN, InAlN, diamond and boron nitride. The material of region 15 can also be p-type oxides, such as nickel oxide and copper oxide. An exemplary thickness of region 15 is 10 nm to 2 μm and an exemplary width of region 15 (along the A-A' direction) is 50 nm to 10 μm. The spacing between the two neighboring region 15 can be identical or different from the width of region 15, with an exemplary spacing of 50 nm to 10 μm. The said spacing between the two neighboring region 15 can be identical in the whole device region and can also vary. According to some embodiments, various methods can be adopted for the formation of region 15, including but not limiting to selective-area epitaxy in etched trenches, ion implantation, sputtering and chemical vapor deposition (CVD). The selective-area epitaxy can be implemented by using dielectric or metal masks through various epitaxy technologies, such as CVD, metal-organic chemical vapor deposition (MOCVD), molecular beam epitaxy (MBE) or metal-organic vapor phase epitaxy (MOVPE).

16, 17, and 18 are the source electrode, gate electrode and drain electrode for the HEMT. The source and drain electrodes 16 and 18 form a connection (e.g. Ohmic contact) to the 2DEG at the heterostructure. The said gate electrode 17 partially or completely overlaps with the plurality of regions 15. The device threshold voltage is positive. At zero gate bias, the 2DEG channels under gate are depleted by the neighboring regions 15 in the lateral direction, such to enable the normally-off operation.

Figure 2D:
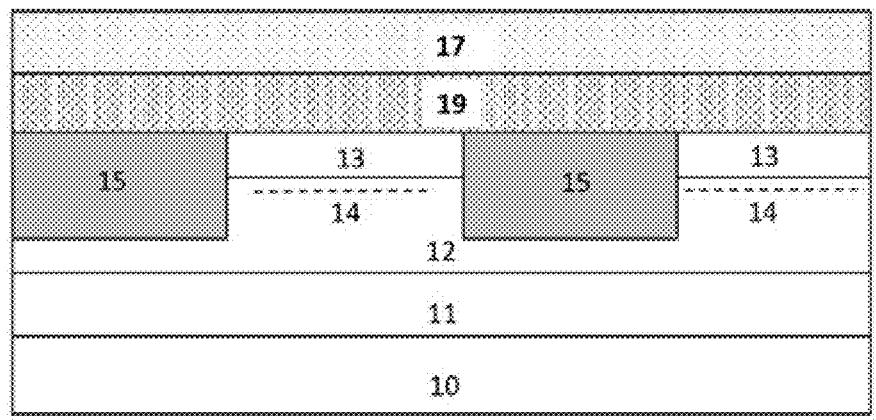
Figure 2E:
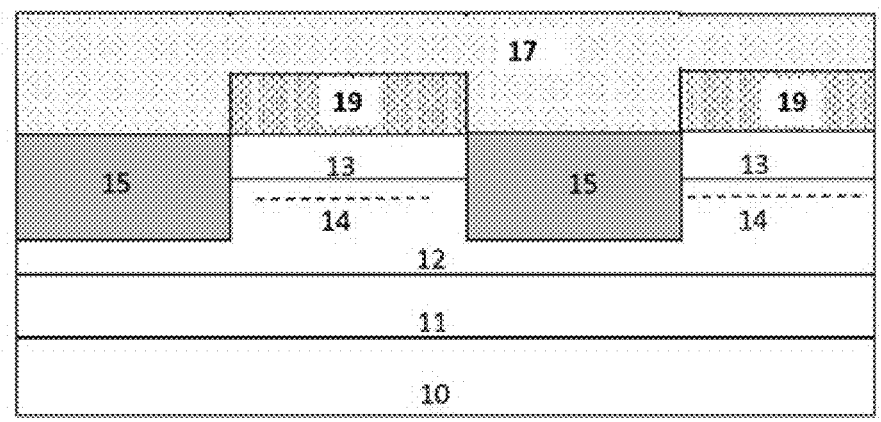

FIGS. 2C-2D show the cross-sectional diagrams of the device structure along the A-A' direction in the gate region, for three different embodiments. In some embodiments (FIG. 2C), the gate layer 17 forms direct contact to the semiconductor layer 13 and the semiconductor regions 15. The gate metal can form a Schottky contact to the layer 13 and can form either Schottky or Ohmic contact to the region 15. In some embodiments (FIG. 2D), a dielectric layer 19 is disposed on the layer 13 and the regions 15 below the gate electrode 17, forming a metal-insulator-semiconductor (MIS) or a MOS gate stack to both layer 13 and regions 15. The materials of regions 19 may include but is not limited to $SiO_2$, $Si_xN_y$, $Si_xO_yN_zH_w$, $Al_2O_3$, $HfO_2$, etc. In some embodiments (FIG. 2E), the dielectric layer 19 is only disposed on top of layer 13 and is removed on top of regions 15. The gate electrode 17 forms the MIS or MOS gate stack to the 2DEG channel and forms Schottky or Ohmic contact to the charge-compensation regions 15.

HEMTs with Improved Electric Field Management

Figure 3A:
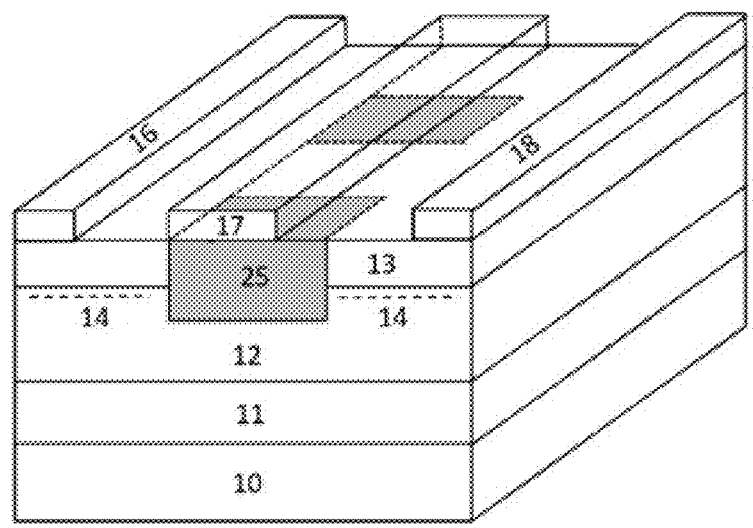
FIGS. 3A-3D are simplified diagrams illustrating various exemplary GaN-based HEMTs with improved electric field management.
Figure 3B:
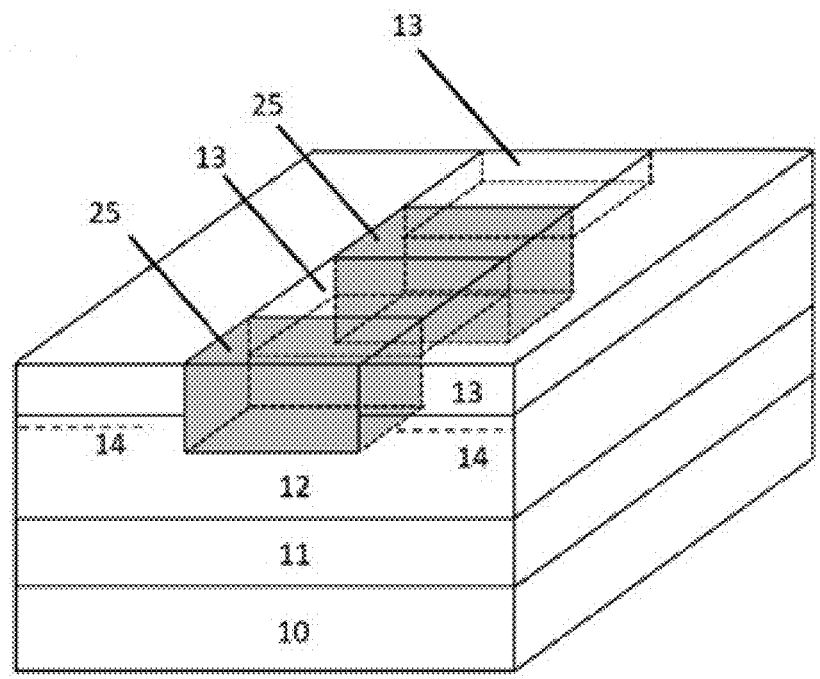
Figure 3C:
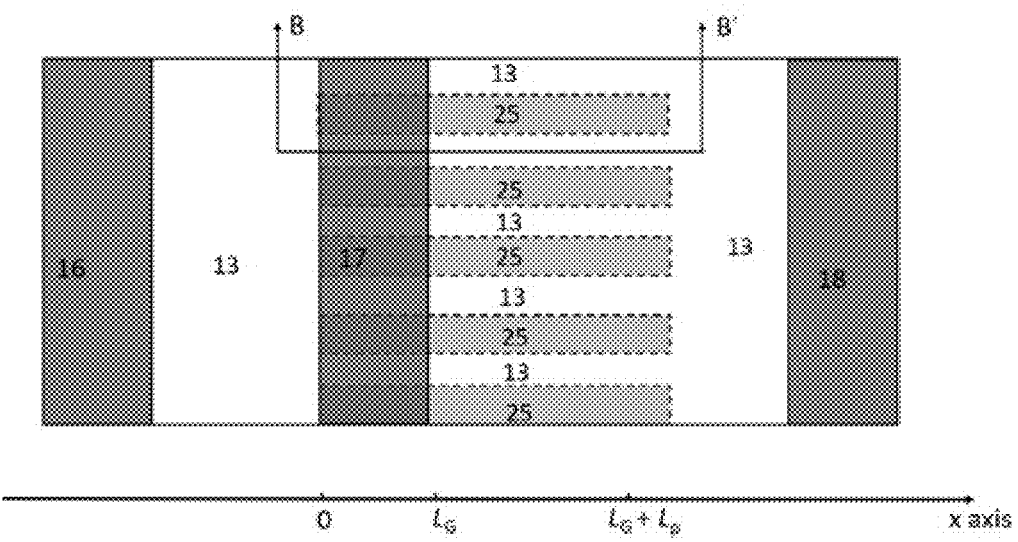

FIGS. 3A-3C show the simplified diagrams illustrating one embodiment of the GaN-based HEMTs with improved electric field management. In this embodiment, a plurality of p-type regions 25 are formed extending downward through the layer 13 into the layer 12. The plurality of regions 25 partially overlaps with the gate electrode 17 and extends laterally into the area between gate and drain. A plurality of alternating p-doped regions 25 and 2DEG heterostructures are formed in at least part of the gate-to-drain area. The length of regions 25 could be larger than the length of the gate electrode 17 ($L_G$) and smaller than the sum of $L_G$ and gate-to-drain distance. The ranges of the width and depth of region 25 and the spacing between two neighboring regions 25 could be identical to the region 15 in the embodiment #1.

The design principle for the regions 25 is to realize the charge balance with the 2DEG channel 14. Four parameters, the width (w), depth (t) and doping concentration ($N_A$) of each region 25 as well as the spacing (s) between two neighboring regions 25, are key factors for the optimal design. The optimal design could meet the following relations:

$$n_{2DEG} \cdot s = N_A \cdot t \cdot w$$

where $n_{2DEG}$ is the 2DEG density ($cm^{-2}$).

Figure 3D:
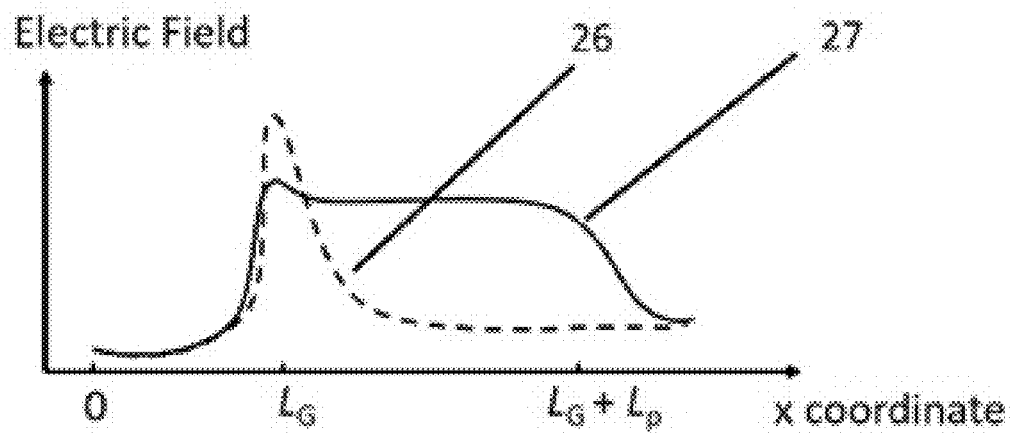

FIG. 3D shows the schematic distribution of electric field along the outline B-B' with (solid line) and without (dashed line) the charge-compensation regions 25. The incorporation of regions 25 reshapes the electric field distribution in 2DEG channels at high off-state drain biases. For the same drain bias, the peak electric field at the drain-side edge of the gate is reduced and the electric field distribution in the gate-to-drain area is much more uniform. With optimal designs, the electric field distribution between the gate electrode and drain electrode could be completely uniform. For the same gate-to-drain distance, the device breakdown voltage could be higher with the incorporation of regions 25.

HEMTs with Avalanche Capability

Figure 4A:
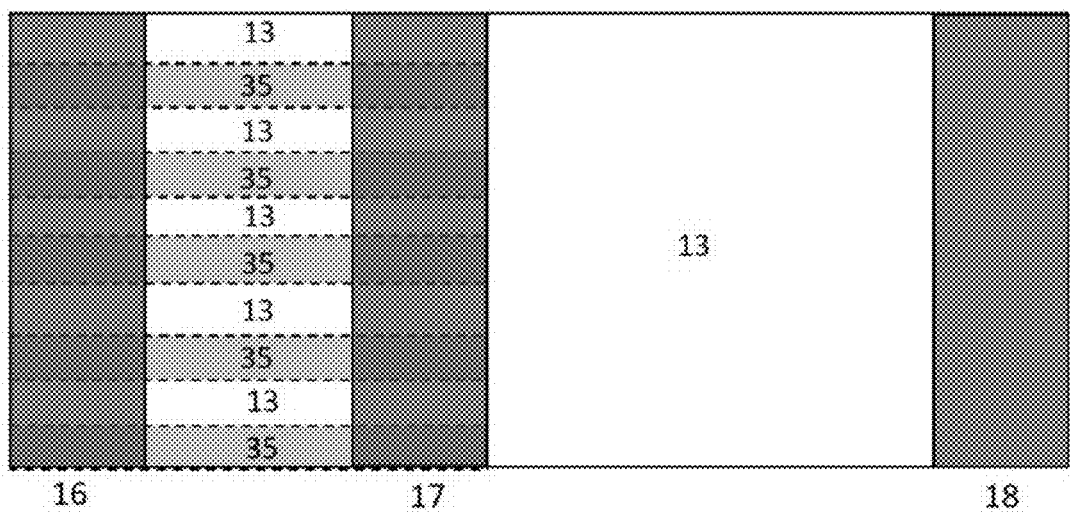
FIGS. 4A-4C are simplified top-view diagrams illustrating various exemplary aspects of the GaN-based HEMTs with avalanche breakdown capability.
Figure 4B:
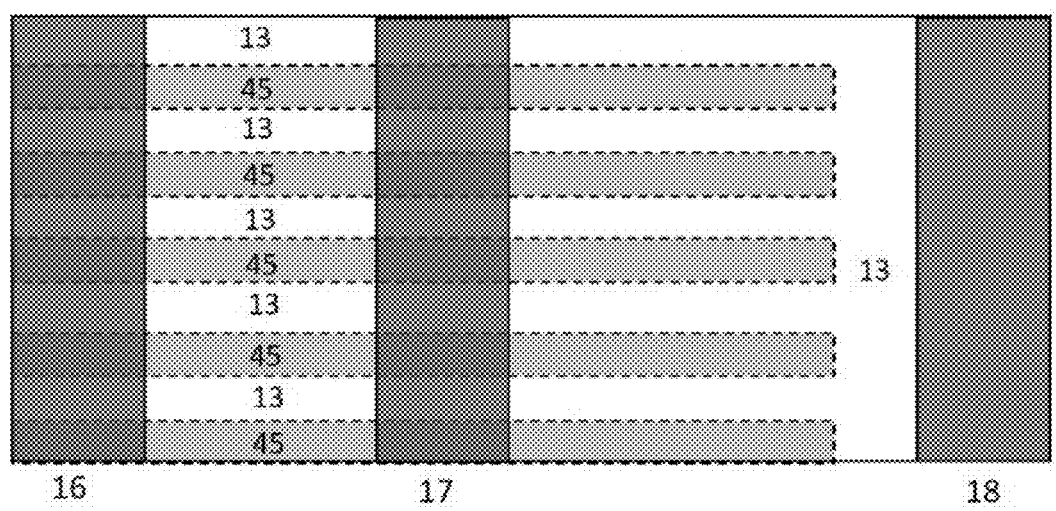
Figure 4C:
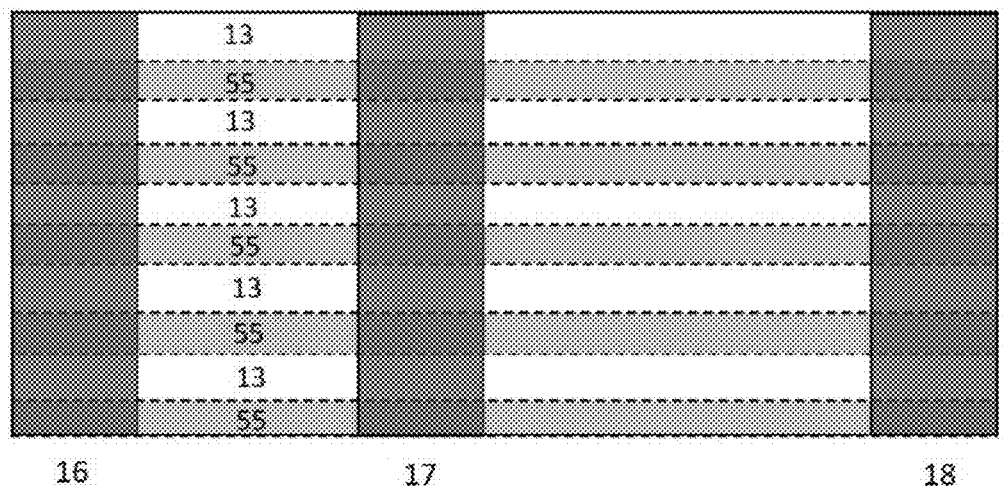

FIGS. 4A-4C show the simplified diagrams illustrating three embodiments of the GaN-based HEMTs with the avalanche breakdown capability. In these embodiments, the source electrode 16 forms Ohmic contacts to the 2DEG channel 14 and the plurality of p-type regions 35 (or 45, 55) simultaneously. The plurality of p-type regions extends laterally to the drain-side gate edges, where the peak electric field locates. At high drain bias, the electrons and holes generated during the impact ionization can be effectively removed, where the electrons are removed through the 2DEG channel and the drain electrode and the holes are removed through the p-type charge-compensation structures and the source electrode. Avalanche capability is therefore enabled in HEMTs. The p-type semiconductor regions are designed to achieve the charge balance with the 2DEG channel, similar to the design in the embodiment #2.

In some embodiments, as shown in FIG. 4A, the plurality of p-type regions 35 extends laterally to the drain-side edge of the gate electrode 17. In some embodiments, as shown in FIG. 4B, the plurality of p-type semiconductor regions 45 extends laterally into the gate-to-drain regions. In some embodiments, as shown in FIG. 4C, the plurality of p-type semiconductor regions 55 extends laterally to the drain electrode 18 and can form either Ohmic contacts or Schottky contacts to the drain electrode 18. In all these three embodiments, the plurality of p-type semiconductor regions form Ohmic contact to the source electrode 16.

Figure 5A:
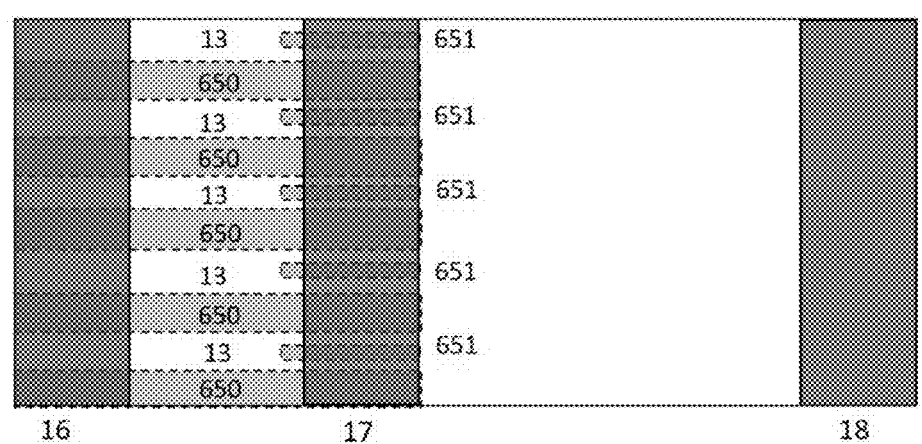
FIGS. 5A-5C depicts simplified top-view diagrams illustrating various exemplary aspects of the E-mode GaN-based HEMTs with avalanche breakdown capability.
Figure 5B:
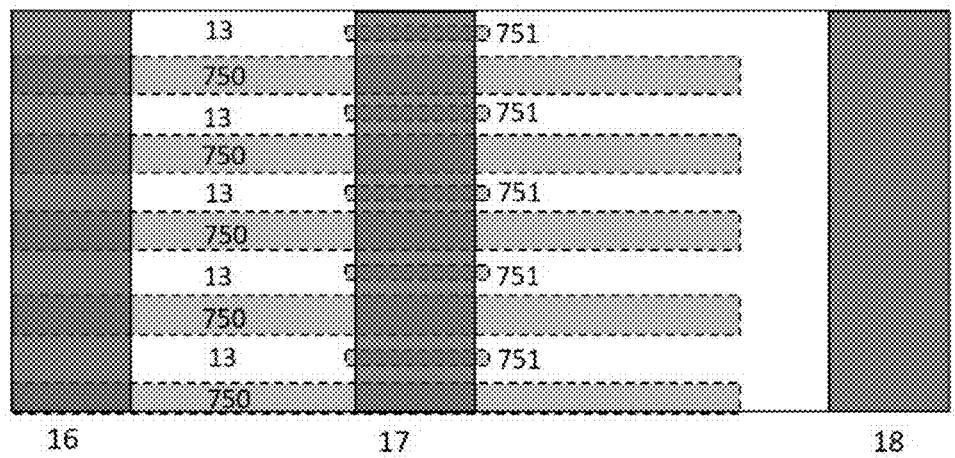
Figure 5C:
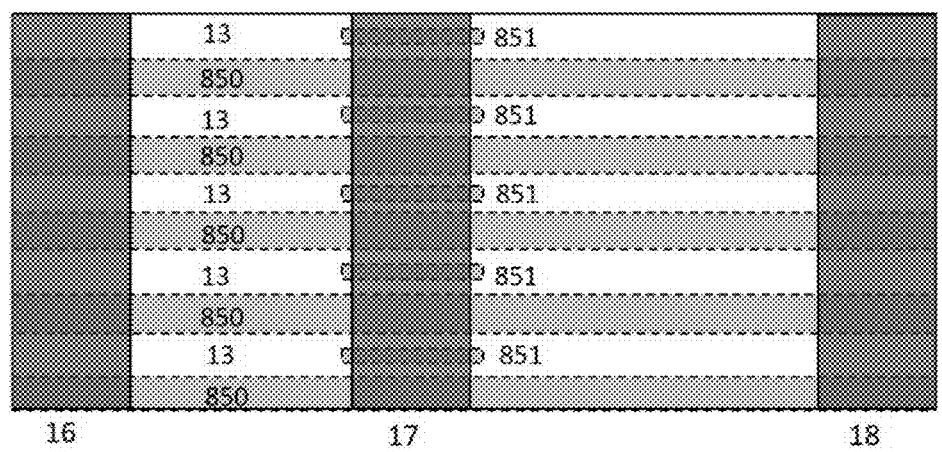

The HEMTs with avalanche capability shown in FIGS. 4A-4C could have either negative or positive threshold voltage, as the charge-compensation designs for avalanche breakdown may not be sufficient to deplete all 2DEG under the gate region at zero gate bias. FIGS. 5A-5C show simplified diagrams illustrating three embodiments with denser plurality of charge-compensation structures under the gate, in the same time having source-connected charge-compensation structures to allow for avalanche breakdown capability. In some embodiments, as shown in FIG. 5A, a plurality of p-type semiconductor regions 650 forms Ohmic contacts to the source electrode 16 and extends laterally to the drain-side edge of the gate electrode 17. An additional plurality of p-type semiconductor regions 651 locate under the gate electrode 17. In some embodiments, as shown in FIG. 5B, a plurality of p-type semiconductor regions 750 forms Ohmic contacts to the source electrode 16 and extends laterally into the gate-to-drain regions. An additional plurality of p-type semiconductor regions 751 locate under the gate electrode 17. In some embodiments, as shown in FIG. 5C, a plurality of p-type semiconductor regions 850 forms Ohmic contacts to the source electrode 16 and extends laterally to the drain electrode 18. An additional plurality of p-type semiconductor regions 851 locate under the gate electrode 17.

Certain Aspects of the Disclosure

The disclosure will be better understood upon reading the following aspects, which should not be confused with the claims. Any of the aspects described herein can, in some instances, be combined with other numbered aspects below or with other aspects described elsewhere herein.

Aspect 1. A high electron mobility transistor (HEMT) device comprising: a plurality of active semiconductor layers formed on a substrate, the plurality of active semiconductor layers comprising at least a III-V semiconductor layer and a barrier layer, wherein a two dimensional electron gas (2DEG) is formed at a heterointerface between the III-V semiconductor layer and the barrier layer; source and drain electrodes each formed in Ohmic contact with the 2DEG; a gate electrode positioned above the barrier layer between the source electrode and the gate electrode; a plurality of charge-compensation regions below the gate electrode, wherein the charge-compensation regions comprise a p-type material and extend through the barrier layer and at least partially through the III-V semiconductor layer.

Aspect 2. A high electron mobility transistor (HEMT) device comprising: a substrate; a semiconductor heterostructure channel region comprising a barrier layer including a first III-V semiconductor material and a channel layer including a second III-V semiconductor material, with the bandgap of said first III-V semiconductor larger than said second III-V semiconductor; a two-dimensional-electron-gas (2DEG) channel, formed in said III-V heterostructure channel region; a source and a drain, which form Ohmic contacts to said 2DEG channel; a gate; a plurality of charge-compensation semiconductor regions extending vertically through said barrier layer into said channel layer, wherein said charge-compensation regions are doped with p-type dopants and are placed aside said 2DEG channel and do not overlap vertically with said 2DEG channel; wherein at least a semiconductor region under the gate is comprised of alternating said heterostructure channel regions and said charge-compensation regions.

Aspect 3. A high electron mobility transistor (HEMT) device comprising: a substrate; a semiconductor heterostructure channel region comprising a barrier layer including a first III-V semiconductor material and a channel layer including a second III-V semiconductor material, with the bandgap of said first III-V semiconductor larger than said second III-V semiconductor; a two-dimensional-electron-gas (2DEG) channel, formed in said III-V heterostructure channel region; a source and a drain, which form Ohmic contacts to said 2DEG channel; a gate; a plurality of charge-compensation semiconductor regions extending vertically through said barrier layer into said channel layer, wherein said charge-compensation regions are doped with p-type dopants and are placed aside said 2DEG channel and do not overlap vertically with said 2DEG channel; wherein the plurality of alternating heterostructure regions and charge-compensation regions extend laterally from said source at least to the drain-side gate edge.

Aspect 4. The HEMT according to any other aspect, wherein the III-V semiconductor layer has a first bandgap, and wherein the barrier layer comprises a second III-V semiconductor layer having a second bandgap larger than the first bandgap.

Aspect 5. The HEMT according to any other aspect, wherein the substrate comprises a III-V semiconductor, silicon, diamond, sapphire, or a combination thereof.

Aspect 6. The HEMT according to any other aspect, further comprising a buffer layer.

Aspect 7. The HEMT according to any other aspect, wherein the buffer layer comprises an adhesion layer, a nucleation layer, a transition layer, a layer for promoting the growth of the compound semiconductor epitaxial layers on lattice-mismatched substrates, a combination thereof, or a combination with one or more additional layers.

Aspect 8. The HEMT according to any other aspect, wherein the charge-compensation semiconductor regions comprise a p-type doped III-V semiconductor.

Aspect 9. The HEMT according to any other aspect, wherein one or more of a doping level of the charge-compensation semiconductor regions, a thickness of each of the charge-compensation semiconductor regions, and a spacing between adjacent charge-compensation semiconductor regions in the plurality of charge-compensation semiconductor regions is designed such that charges in the 2DEG channel are nearly completely depleted when the HEMT is operated at a zero gate bias.

Aspect 10. The HEMT according to any other aspect, wherein one or more of the III-V semiconductor layer, the barrier layer, and the p-type semiconductor in the charge-compensation semiconductor regions are selected from InAlGaN and GaN, AlGaN and GaN, AlN and GaN, or InGaN and GaN.

Aspect 11. The HEMT according to any other aspect, wherein the charge-compensation regions are made by a process comprising trench-filling epitaxy, ion implantation, sputtering or chemical vapor deposition.

Aspect 12. The HEMT according to any other aspect, wherein the charge compensation regions extend at least across an entire gate region extending under the gate electrode.

Aspect 13. The HEMT according to any other aspect, wherein the charge compensation regions extend beyond the gate region.

Aspect 14. The HEMT according to any other aspect, wherein the charge compensation regions extend at least from below the source electrode to below the gate electrode.

Aspect 15. The HEMT according to any other aspect, wherein the charge compensation regions extend from below the source electrode to below the drain electrode.

Aspect 16. The HEMT according to any other aspect, wherein the III-V semiconductor layer has a thickness of about 100 nm to about 10 microns.

Aspect 17. The HEMT according to any other aspect, wherein the barrier layer has a thickness of about 5 nm to about 100 nm.

Aspect 18. The HEMT according to any other aspect, wherein a spacing between adjacent charge compensation regions in the plurality of charge compensation regions is about 50 nm to about 10 µm, about 50 nm to about 500 nm, about 1 µm to about 5 µm, or any combination thereof.

Aspect 19. The HEMT according to any other aspect, wherein a doping density of the charge compensation regions is about $1 \times 10^{16}$ cm$^{-3}$ to about $1 \times 10^{21}$ cm$^{-3}$.

Aspect 20. The HEMT according to any other aspect, wherein a thickness of the charge compensation regions is about 10 nm to 1 µm.

Aspect 21. The HEMT according to any other aspect, wherein a thickness of the charge compensation regions is larger than a thickness of the barrier layer.

Aspect 22. The HEMT according to any other aspect, wherein the plurality of charge compensation regions comprises a first plurality of charge compensation regions extending from below the gate to make Ohmic contact with the source electrode and a second plurality of charge compensation regions extending below the gate electrode but without making Ohmic contact with the source electrode.

Aspect 23. The HEMT according to any other aspect, wherein the materials of said charge-compensation regions include said first III-V semiconductor material, said second III-V semiconductor materials, other III-V semiconductor materials and diamond.

Aspect 24. The HEMT according to any other aspect, wherein the materials of said barrier layer and channel layer include InAlGaN and GaN, AlGaN and GaN, AlN and GaN, or InGaN and GaN.

Aspect 25. The HEMT according to any other aspect, wherein said charge-compensation regions are made by trench-filling epitaxy or ion implantation.

Aspect 26. The HEMT according to any other aspect, wherein the thickness, doping concentration and width of said charge-compensation regions as well as the spacing between neighboring charge-compensation regions are designed to completely deplete charges in the 2DEG channel at zero gate bias.

Aspect 27. The HEMT according to any other aspect, further comprising a dielectric layer between said gate and the said semiconductor region comprising alternating heterostructure channel regions and charge-compensation regions.

Aspect 28. The HEMT according to any other aspect, further comprising a dielectric layer between said gate and the said heterostructure channel regions under said gate.

Aspect 29. The HEMT according to any other aspect, wherein the plurality of alternating heterostructure regions and charge-compensation regions extend laterally into the gate-to-drain region.

Aspect 30. The HEMT according to any other aspect, wherein the said charge-compensation regions are designed to realize the charge balance with said 2DEG channel.

Aspect 31. The HEMT according to any other aspect, wherein the plurality of alternating heterostructure regions and charge-compensation regions extend laterally from said source at least to the drain-side gate edge;

Aspect 32. The HEMT according to any other aspect, wherein said source forms Ohmic contacts to said charge-compensation regions.

Aspect 33. The HEMT according to any other aspect, wherein the plurality of alternating heterostructure regions and charge-compensation regions extend laterally into the gate-to-drain regions.

Aspect 34. The HEMT according to any other aspect, wherein the plurality of alternating heterostructure regions and charge-compensation regions extend laterally from said source to said drain.

Aspect 35. The HEMT according to any other aspect, wherein the plurality of charge-compensation regions form Ohmic or Schottky contacts to said drain.

Aspect 36. The HEMT according to any other aspect, wherein said charge-compensation regions are designed to realize the charge balance with said 2DEG channel.

Aspect 37. The HEMT according to any other aspect, wherein the materials of said charge-compensation regions include said first III-V semiconductor material, said second III-V semiconductor materials, other III-V semiconductor materials and diamond.

Aspect 38. The HEMT according to any other aspect, wherein the materials of said barrier layer and channel layer include InAlGaN and GaN, AlGaN and GaN, AlN and GaN, or InGaN and GaN.

Aspect 39. The HEMT according to any other aspect, wherein said charge-compensation regions are made through trench-filling epitaxy or ion implantation.

Aspect 40. The HEMT according to any other aspect, further comprising a gate dielectric layer between said gate and said barrier layer.

Aspect 41. The HEMT according to any other aspect, wherein the width of each heterostructure band is smaller in the gate region compared to the width of heterostructure band in the source-to-gate region.

Aspect 42. The HEMT according to any other aspect, wherein the charge compensation region makes Ohmic contact with the source electrode.

Aspect 43. The HEMT according to any other aspect, wherein the charge compensation region makes Ohmic contact with the drain electrode.

Aspect 44. The HEMT according to any other aspect, wherein the p-type material comprises a p-type oxide such as nickel oxide or copper oxide.

REFERENCES

The following references are provided to assist in better understanding the disclosure and technologies described therein. The citation of any publication is for disclosure purposes only and should not be construed as an admission that the publication is material in any way to patentability of the claims nor that the present disclosure is not entitled to antedate such publication by virtue of prior disclosure. Further, the dates of publication provided could be different from the actual publication dates that may need to be independently confirmed.

[1] "U.S. Pat. No. 7,816,707—Field-effect transistor with nitride semiconductor and method for fabricating the same."
[2] "U.S. Pat. No. 7,728,356—P—GaN/AlGaN/AlN/GaN enhancement-mode field effect transistor."
"U.S. Pat. No. 8,076,698—Transistor and method for operating the same."
"U.S. Pat. No. 8,193,452—Enhancement mode gallium nitride power devices."
[5] Y. Uemoto et al., "Gate Injection Transistor (GIT)—A Normally-Off AlGaN/GaN Power Transistor Using Conductivity Modulation," IEEE Trans. Electron Devices, vol. 54, no. 12, pp. 3393-3399, 2007.
[6] "U.S. Pat. No. 6,777,278—Methods of fabricating aluminum gallium nitride/gallium nitride high electron mobility transistors having a gate contact on a gallium nitride based cap segment."
[7] "U.S. Pat. No. 8,653,559—AlGaN/GaN hybrid MOS-HFET."
[8] "Enhancement-mode gan hybrid mos-hemts with $R_{on}$ of 20 mω-cm$^2$—IEEE Conference Publication."
[9] Y. Cai, Y. Zhou, K. M. Lau, and K. J. Chen, "Control of Threshold Voltage of AlGaN/GaN HEMTs by Fluoride-Based Plasma Treatment: From Depletion Mode to Enhancement Mode," IEEE Trans. Electron Devices, vol. 53, no. 9, pp. 2207-2215, 2006.
[10] "U.S. Pat. No. 7,932,539—Enhancement-mode III-N devices, circuits, and methods."
[11] "U.S. Pat. No. 9,704,959—Enhancement-mode transistors with increased threshold voltage."
[12] Y. Zhang, M. Sun, S. J. Joglekar, T. Fujishima, and T. Palacios, "Threshold voltage control by gate oxide thickness in fluorinated GaN metal-oxide-semiconductor high-electron-mobility transistors," Appl. Phys. Lett., vol. 103, no. 3, p. 033524, July 2013.
[13] "U.S. Pat. No. 7,501,670—Cascode circuit employing a depletion-mode, GaN-based FET."
[14] "U.S. Pat. No. 8,084,783—GaN-based device cascoded with an integrated FET/Schottky diode device."
[15] "U.S. Pat. No. 8,264,003—Merged cascode transistor."
[16] "U.S. Pat. No. 9,041,003—Semiconductor devices having a recessed electrode structure."
[17] "U.S. Pat. No. 8,759,879—RESURF III-Nitride HEMTs."
[18] "U.S. Pat. No. 6,100,549—High breakdown voltage RESURF HFET."
[19] "U.S. Pat. No. 9,583,607—Semiconductor device with multiple-functional barrier layer."
[20] "U.S. Pat. No. 8,891,266—Monolithic high voltage multiplier having high voltage semiconductor diodes and high-k capacitors."
[21] "U.S. Pat. No. 9,281,389—Semiconductor device."

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

I claim:

1. A high electron mobility transistor (HEMT) device comprising:
a plurality of active semiconductor layers formed on a substrate, the plurality of active semiconductor layers comprising at least a III-V semiconductor layer and a barrier layer, wherein a two dimensional electron gas (2DEG) is formed at a heterointerface between the III-V semiconductor layer and the barrier layer;
source and drain electrodes each formed in Ohmic contact with the 2DEG;
a gate electrode positioned above the barrier layer between the source electrode and the drain electrode;
a plurality of charge-compensation regions below the gate electrode, wherein the charge-compensation regions comprise a p-type material and extend through the barrier layer and at least partially through the III-V semiconductor layer, and wherein adjacent charge-compensation regions of the plurality of charge-compensation regions are separated by non p-type regions of the III-V semiconductor layer and non p-type regions of the barrier layer.

2. The HEMT according to claim 1, wherein the III-V semiconductor layer has a first bandgap, and
wherein the barrier layer comprises a second III-V semiconductor layer having a second bandgap larger than the first bandgap.

3. The HEMT according to claim 1, wherein the substrate comprises a III-V semiconductor, silicon, diamond, sapphire, or a combination thereof.

4. The HEMT according to claim 1, further comprising a buffer layer.

5. The HEMT according to claim 4, wherein the buffer layer comprises an adhesion layer, a nucleation layer, a transition layer, a layer for promoting a growth of compound semiconductor epitaxial layers on lattice-mismatched substrates, a combination thereof, or a combination with one or more additional layers.

6. The HEMT according to claim 1, wherein the p-type material comprises a p-type doped III-V semiconductor or a p-type oxide such as nickel oxide or copper oxide.

7. The HEMT according to claim 1, wherein one or more of a doping level of the charge-compensation regions, a thickness of each of the charge-compensation regions, and a spacing between adjacent charge-compensation regions in the plurality of charge-compensation regions is designed such that charges in the 2DEG are nearly completely depleted when the HEMT is operated at a zero gate bias.

8. The HEMT according to claim 1, wherein one or more of the III-V semiconductor layer, the barrier layer, and the p-type material are selected from InAlGaN and GaN, AlGaN and GaN, AlN and GaN, or InGaN and GaN.

9. The HEMT according to claim 1, wherein the charge-compensation regions are made by a process comprising trench-filling epitaxy, ion implantation, sputtering or chemical vapor deposition.

10. The HEMT according to claim 1, wherein the charge compensation regions extend at least across an entire gate region extending under the gate electrode.

11. The HEMT according to claim 10, wherein the charge compensation regions extend beyond the gate region.

12. The HEMT according to claim 10, wherein the charge compensation regions extend at least from below the source electrode to below the gate electrode, and wherein the charge compensation regions make Ohmic contact with the source electrode.

13. The HEMT according to claim 10, wherein the charge compensation regions extend from below the source electrode to below the drain electrode, and wherein the charge compensation regions make Ohmic contact with the source electrode.

14. The HEMT according to claim 1, wherein the III-V semiconductor layer has a thickness of about 100 nm to about 10 microns.

15. The HEMT according to claim 1, wherein the barrier layer has a thickness of about 5 nm to about 100 nm.

16. The HEMT according to claim 1, wherein a spacing between adjacent charge compensation regions in the plurality of charge compensation regions is about 50 nm to about 10 μm, about 50 nm to about 500 nm, about 1 μm to about 5 μm, or any combination thereof.

17. The HEMT according to claim 1, wherein a doping density of the charge compensation regions is about $1\times10^{16}$ $cm^{-3}$ to about $1\times10^{21}$ $cm^{-3}$.

18. The HEMT according to claim 1, wherein a thickness of the charge compensation regions is about 10 nm to 1 μm.

19. The HEMT according to claim 1, wherein a thickness of the charge compensation regions is larger than a thickness of the barrier layer.

20. The HEMT according to claim 1, wherein the plurality of charge compensation regions comprises a first plurality of charge compensation regions extending from below the gate to make Ohmic contact with the source electrode and a second plurality of charge compensation regions extending below the gate electrode but without making Ohmic contact with the source electrode.

* * * * *